(12) United States Patent
Beccue

(10) Patent No.: US 9,735,786 B2
(45) Date of Patent: Aug. 15, 2017

(54) APPARATUS AND METHODS FOR SINGLE PHASE SPOT CIRCUITS

(71) Applicant: ANALOG DEVICES, INC., Norwood, MA (US)

(72) Inventor: Stephen Mark Beccue, Thousand Oaks, CA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/395,237

(22) Filed: Dec. 30, 2016

(65) Prior Publication Data

US 2017/0201257 A1 Jul. 13, 2017

Related U.S. Application Data

(63) Continuation of application No. 14/993,860, filed on Jan. 12, 2016, now Pat. No. 9,543,962.

(51) Int. Cl.
| | | |
|---|---|---|
| *H03M 1/50* | (2006.01) | |
| *H03K 21/02* | (2006.01) | |
| *G04F 10/00* | (2006.01) | |
| *H03K 17/687* | (2006.01) | |

(52) U.S. Cl.
CPC ......... *H03K 21/026* (2013.01); *G04F 10/005* (2013.01); *H03K 17/687* (2013.01)

(58) Field of Classification Search
CPC .................................................... H03K 17/687
USPC ................................................ 341/155–165
See application file for complete search history.

(56) References Cited

U.S. PATENT DOCUMENTS

| | | |
|---|---|---|
| 3,555,298 A | 1/1971 | Neelands |
| 3,679,913 A | 7/1972 | Foltz |
| 3,939,643 A | 2/1976 | Nishikubo |
| 4,535,257 A | 8/1985 | Hareyama |
| 4,688,018 A | 8/1987 | Vaughn |
| 5,349,622 A | 9/1994 | Gorisse |
| 5,914,996 A | 6/1999 | Huang |
| 6,617,893 B1 | 9/2003 | Born |

(Continued)

OTHER PUBLICATIONS

Pellerano et al., "A 13.5-mW 5-GHz Frequency Synthesizer With Dynamic-Logic Frequency Divider", IEEE Journal of Solid-State Circuits, vol. 39, No. 2, Feb. 2004, pp. 378-383.

(Continued)

*Primary Examiner* — Lam T Mai
(74) *Attorney, Agent, or Firm* — Knobbe, Martens, Olson & Bear LLP

(57) ABSTRACT

Provided herein are apparatus and methods for single phase spot circuits. In certain implementations, a single phase spot circuit propagates a spot from input to output in response to a clock edge of a single phase clock signal. The single phase spot circuit holds the spot for about one clock cycle, thereby providing higher maximum operating frequency relative to multiphase spot circuits that hold a spot for about half of a clock cycle. Two or more single phase spot circuits can be electrically connected in a ring to operate as a spot divider. The single phase spot circuits can be used to advance a spot, represented using either a one or a zero, from one spot circuit to the next in response to a clock edge. In certain implementations, as the spot advances, a single phase spot circuit clears the spot from its input via a feedback element.

20 Claims, 11 Drawing Sheets

(56) References Cited

U.S. PATENT DOCUMENTS

| | | | |
|---|---|---|---|
| 7,088,154 B2 | 8/2006 | Ngo | |
| 7,298,810 B2 | 11/2007 | Ke | |
| 7,750,692 B2 | 7/2010 | Mohammadi | |
| 7,812,648 B2 | 10/2010 | Wood | |
| 7,948,279 B2 | 5/2011 | Lin | |
| 8,593,317 B2 | 11/2013 | Aras | |
| 8,717,073 B2 | 5/2014 | Ichikawa | |
| 8,917,122 B1 | 12/2014 | Koerner | |
| 8,988,119 B2 | 3/2015 | Danny et al. | |
| 9,013,213 B2 | 4/2015 | Chandrashekar et al. | |
| 9,543,962 B1 * | 1/2017 | Beccue | H03K 23/002 |
| 2005/0093587 A1 | 5/2005 | Knapp et al. | |
| 2008/0224910 A1 | 9/2008 | Chen | |
| 2012/0280839 A1 | 11/2012 | Fan | |
| 2013/0176155 A1 | 7/2013 | Aras | |
| 2015/0102952 A1 | 4/2015 | Yang | |

OTHER PUBLICATIONS

Lee et al., "A 40-GHz Frequency Divider in 0.18μm CMOS Technology", IEEE Journal of Solid-State Circuits, vol. 39, No. 4, Apr. 2014, pp. 594-601.

Wohlmuth et al., "A High Sensitivity Static 2:1 Frequency Divider up to 27 GHz in 120 nm CMOS", ESSCIRC, 2002, pp. 823-826.

Foroudi et al., "CMOS High-Speed Dual-Modulus Frequency Divider for RF Frequency Synthesis", IEEE Journal of Solid-State Circuits, vol. 30, No. 2, Feb. 1995, pp. 93-100.

Singh et al., "High-Frequency CML Clock Dividers in 0.13μm CMOS Operating Up to 38 GHz", IEEE Journal of Solid-State Circuits, vol. 40, No. 8, Aug. 2005, pp. 1658-1661.

* cited by examiner

APPARATUS AND METHODS FOR SINGLE PHASE SPOT CIRCUITS

CROSS-REFERENCE TO RELATED APPLICATIONS

This application is a continuation of U.S. application Ser. No. 14/993,860, filed Jan. 12, 2016, and titled "APPARATUS AND METHODS FOR SINGLE PHASE SPOT CIRCUITS," the entire disclosure of which is hereby incorporated herein by reference.

BACKGROUND

Field

Embodiments of the invention relate to electronic circuits, and more particularly, to spot circuits.

Description of the Related Technology

A spot circuit or spot-moving stage can be used in a wide variety of applications.

In one example, a frequency divider includes spot circuits electrically connected in a ring, and the frequency divider is used to divide an input clock signal to generate an output clock signal. Each spot circuit is operable to pass or move a spot, which can be represented using a logical one or zero, to the next spot circuit in the ring. The spot advances from one spot circuit to the next based on timing of the input clock signal, and the output clock signal is generated based on a time taken by the spot to move around the ring.

The frequency divider, in turn, can be used in a wide variety of applications, such as in phase locked loops (PLLs) or frequency synthesizers. For instance, a PLL can use the frequency divider to divide the output of a controllable oscillator to generate a feedback clock signal used by a phase frequency detector (PFD).

SUMMARY

One aspect of this disclosure is a spot divider comprising two or more spot circuits. The two or more spot circuits are electrically connected in a ring and comprise a first single phase spot circuit having a spot input, a spot output, and a clock input. The single phase spot circuit comprises a first input field effect transistor (FET) of a first polarity, a first clock FET of a second polarity opposite the first polarity, a second input FET of the second polarity, a second clock FET of the first polarity, and an output FET of the first polarity. The first input FET is electrically connected between a first supply node and a signal node, and a gate of the first FET is electrically connected to the spot input. The second input FET is electrically connected in series with the first clock FET between the signal node and a second supply node. Also, a gate of the first clock FET and a gate of the second clock FET are electrically connected to the clock input. Additionally, the output FET is electrically connected in series with the second clock FET between the first supply node and the spot output; and a gate of the output FET is electrically connected to the signal node.

In another aspect of this disclosure a time-to-digital converter comprises two or more spot circuits electrically connected in a cascade. The two or more spot circuits comprise a first single phase spot circuit having a spot input, a spot output, and a clock input. The first single phase spot circuit comprises a first input field effect transistor (FET) of a first polarity, a clock FET of a second polarity opposite the first polarity, a second input FET of the second polarity, and an output FET of the first polarity. The first FET is electrically connected between a first supply node and a signal node, and a gate of the first FET is electrically connected to the spot input. The clock FET is electrically connected to the clock input. The second input FET is electrically connected in series with the clock FET between the signal node and a second supply node; and the output FET is electrically connected between the first supply node and the spot output. Also, a gate of output FET is electrically connected to the signal node.

In another aspect of this disclosure a method of moving a spot using a single clock signal phase is provided. The method comprises providing a spot signal to a spot input of a single phase spot circuit. The method comprises providing a single phase clock signal varying between a first logic voltage and a second logic voltage to a clock input of the single phase spot circuit. The method also comprises blocking transmission of the spot signal to a spot output of the single phase spot circuit when the spot signal has the first logic voltage; and the method comprises transmitting the data signal to the data output of the single phase spot circuit in response to a clock edge of the single phase clock signal when the data input has the second logic voltage.

DETAILED DESCRIPTION OF EMBODIMENTS

Figure 1:
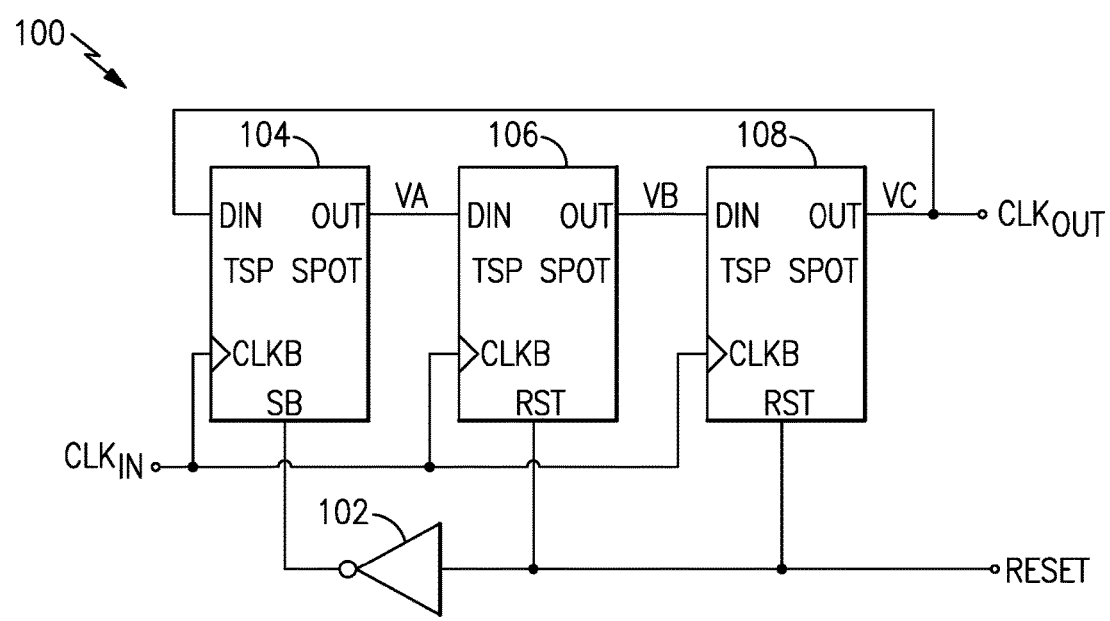
FIG. 1 is a schematic diagram of a true single phase (TSP) spot divider according to one embodiment.

The following detailed description of embodiments presents various descriptions of specific embodiments of the invention. However, the invention can be embodied in a multitude of different ways as defined and covered by the claims. In this description, reference is made to the drawings in which like reference numerals may indicate identical or functionally similar elements.

Frequency dividers can be included in high speed phase locked loops (PLLs), clock distribution circuits, frequency translators, and/or other circuitry to provide frequency division of clock signals. A frequency divider's speed and power performance can be important for a variety of applications. For instance, in a frequency synthesizer application, the performance of a frequency divider can impact the synthesizer's power, frequency, and/or phase noise specifications.

A spot divider can include two or more spot circuits electrically connected in a ring. Each spot circuit passes or moves a spot (for example, a logical one) to the next spot circuit in the ring. The spot advances from one spot circuit to the next based on timing of an input clock signal, and the spot divider generates an output clock signal based on the time it takes for the spot to move around the ring. Additional details of spot dividers and spot circuits can be as described in commonly-owned U.S. Pat. No. 7,812,648, issued Oct.

12, 2012, and titled "FREQUENCY DIVIDER," the entire disclosure of which is hereby incorporated by reference.

Spot dividers provide a wide variety of benefits relative to other types of frequency dividers. For example, spot dividers are substantially faster than conventional complementary metal oxide semiconductor (CMOS) dividers. Additionally, spot dividers can have lower power consumption and/or exhibit better phase noise performance relative to current mode logic (CML) and/or prescaler-based dividers.

Certain spot dividers are implemented using spot circuits that operate using multiple clock signal phases, such as both a non-inverted clock signal and an inverted clock signal, to move the spot. However, operating a spot divider using multiple clock signal phases can limit the spot divider's maximum operating frequency.

For instance, a multiphase spot circuit can be implemented to hold a spot when a non-inverted clock signal is logically high and an inverted clock signal is logically low, and to move the spot when the non-inverted clock signal is logically low and the inverted clock signal is logically high. When a spot divider is implemented using such multiphase spot circuits, each multiphase spot circuit can hold the spot for about half of a clock cycle. At high operating frequencies, the multiphase spot circuits may not have sufficient time to properly function in a half clock cycle, and thus may limit the spot divider's maximum operating frequency. In contrast, a single phase spot circuit can hold a spot for about a full clock cycle. By holding the spot for a longer duration of the clock cycle, the single phase spot circuit operates with relaxed timing constraints. Thus, the single phase spot circuit can operate with a shorter minimum clock period and corresponding higher maximum operating frequency relative to a multiphase spot circuit.

Accordingly, there is a need for a spot circuit capable of operating using only one clock signal phase, and that can meet stringent performance specifications, including those associated with frequency, power, and/or phase noise.

A spot divider capable of operating using only one clock signal phase can be referred to herein as a single phase or true single phase (TSP) spot divider. Additionally, a spot circuit capable of operating using only one clock signal phase can be referred to herein as a single phase or TSP spot circuit.

In contrast to a spot divider that operates using two or more clock signal phases, such as a non-inverted clock signal and an inverted clock signal, a TSP spot divider can be smaller and/or faster.

For example, a multiphase spot divider can include complementary pairs of spot stages that operate using different clock signal phases. For instance, a particular complementary pair of spot stages can include a first spot stage implemented with 6 transistors and that operates using a non-inverted clock signal, and a second spot stage implemented with 6 transistors and that operates using an inverted clock signal. Such a complementary pair of spot stages can include 12 transistors and operate using two clock signal phases. In contrast, certain TSP spot circuits herein include 7 transistors and operate using a single clock signal phase. Thus, a TSP spot divider can have fewer transistors and lower clock capacitance relative to a multiphase spot divider, and can operate at higher frequency while still maintaining low phase noise.

Additionally, relative to a multiphase spot divider that operates using multiple clock signal phases and multiple corresponding clock buffers, a TSP spot divider can operate using fewer number of clock buffers. Thus, the teachings herein can be used to eliminate clock buffers for additional clock signal phases relative to a multiphase spot divider implementation.

FIG. 1 is a schematic diagram of a TSP spot divider 100 according to one embodiment. The TSP spot divider 100 includes an inverter 102, a first TSP spot circuit 104, a second TSP spot circuit 106, and a third TSP spot circuit 108. The TSP spot divider 100 receives a single phase clock signal $CLK_{IN}$ and a reset signal RESET, and generates an output clock signal $CLK_{OUT}$.

The TSP spot circuits 104, 106, 108 each have a data input DIN, a data output OUT, and a clock input CLKB. The first TSP spot circuit 104 additionally includes a set input SB, while the second and third TSP spot circuits 106, 108 each additionally include a reset input RST. As shown in FIG. 1, the reset signal RESET is provided to the reset inputs RST of the second and third TSP spot circuits 106, 108 and to an input of the inverter 102. The inverter 102 further includes an output that provides an inverted version of the reset signal RESET to the set input SB of the first TSP spot circuit 104.

The TSP spot circuits 104, 106, 108 are electrically connected in a ring. For example, the data output OUT of the first TSP spot circuit 104 is electrically connected to the data input DIN of the second TSP spot circuit 106 at a signal node VA, the data output OUT of the second TSP spot circuit 106 is electrically connected to the data input DIN of the third TSP spot circuit 108 at a signal node VB, and the data output OUT of the third TSP spot circuit 108 is electrically connected to the data input DIN of the first TSP spot circuit 104 at a signal node VC to form a ring. As shown in FIG. 1, the output clock signal $CLK_{OUT}$ is provided from the signal node VC.

Although a TSP spot divider including three TSP spot circuits is illustrated, the teachings herein are applicable to configurations including more or fewer TSP spot circuits. Moreover, a spot divider can be implemented using a combination of one or more TSP spot circuits and one or more multiphase spot circuits, such as those disclosed in U.S. Pat. No. 7,812,648, which was incorporated by reference in its entirety earlier.

As shown in FIG. 1, each of the TSP spot circuits 104, 106, 108 receives the single phase clock signal $CLK_{IN}$ at a respective clock input CLKB. The illustrated TSP spot divider 100 is operable to divide a frequency of the single phase clock signal $CLK_{IN}$ by a factor of three. Thus, the frequency of the output clock signal $CLK_{OUT}$ can be about a factor of three smaller than the frequency of the input clock signal $CLK_{OUT}$. However, by configuring the TSP spot divider 100 to include more or fewer TSP spot circuits, a desired factor of frequency division can be obtained.

The TSP spot divider 100 has been configured to operate with state initialization or reset functionality. In particular, in the illustrated embodiment, the reset input RESET can be pulsed to set the first TSP spot circuit 104 in a "1" state, to reset the second TSP spot circuit 106 to a "0" state, and to reset the third TSP spot circuit 108 to a "0" state. By resetting the TSP spot divider 100 in this manner, the first TSP spot circuit 104 can be initialized to begin holding the spot. For instance, the logic pulse of the reset input RESET can force the logic levels at signal nodes VA, VB, and VC to be high, low, and low respectively. Implementing a TSP spot divider to include reset functionality can ensure proper circuit operations and/or aid in generating an output clock signal with a known phase.

Although one example of reset functionality is shown, a spot divider can be reset in a wide variety of ways. For example, one or more of a spot divider's TSP spot circuits can include set and/or reset inputs, including, for instance, inputs that are synchronous or asynchronous and/or that operate using non-inverted or inverted logic polarity.

In the illustrated embodiment, the spot corresponds to a logical one, which is moved around the ring based on timing of the input clock signal $CLK_{IN}$. However, other implementations are possible, such as configurations in which the spot corresponds to a logical zero that is moved around a ring of spot circuits.

The TSP spot circuits 104, 106, 108 each receive data input logic signals having one of two logic levels, high or low. Additionally, in response to a clock edge of a particular clock cycle, the TSP spot circuits 104, 106, 108 operate to transmit a first logic level corresponding to the spot and to block a complementary logic level. For instance, following a reset logic pulse, the second TSP spot circuit 106 can dynamically transmit the spot (corresponding to a logic high signal, in this example) from the signal node VA to the signal node VB in response to a first clock edge of a first clock cycle. Also during the first clock cycle, the first and third TSP spot circuits 104, 108 can block the transmission of the logic low signals initially at the signal nodes VB and VC. In this way the spot at signal node VA is transmitted to the signal node VB during the first clock cycle. During a second clock cycle subsequent to the first clock cycle, the spot at signal node VB can be transmitted to the signal node VC in a similar manner by the third TSP spot circuit 108.

The TSP spot circuits 104, 106, 108 can each further include a feedback element to cause that particular TSP spot circuit's data input to reset to its complementary logic level after passing the spot to the next TSP spot circuit in the ring. For instance, during the first clock cycle when the spot (logic high signal, in this example) is transmitted from the data input at signal node VA to the data output at signal node VB, the second TSP spot circuit 106 can cause the logic level or state at signal node VA to change to a logic low via the second TSP spot circuit's feedback element. During the second successive clock cycle, the third TSP spot circuit 108 can cause the high state at signal node VB to return to the low state after the spot is passed to the signal node VC.

In the illustrated embodiment, a spot returns to an originating signal node every three clock cycles. For instance, the spot moved to the signal node VB after the first clock cycle returns to the signal node VB after the fourth clock cycle. Therefore, the frequency of the spot signal at node VB is observed to be one third that of the input clock signal $CLK_{IN}$, in this embodiment. Similarly, the frequencies at nodes VA and VC are also about one third of the frequency of the input clock signal $CLK_{IN}$. However, a TSP spot divider can include more or fewer TSP spots circuits in a ring to provide a desired amount of frequency division.

Although the TSP spot divider 100 was described with respect to transmitting a spot having a logic high level or state, the TSP spot divider 100 can also be configured to transmit a spot having a logic low state. Further, more or fewer TSP spot circuits can be electrically connected in a ring to provide frequency dividers having division factors other than three. For instance, two TSP spot circuits can be electrically connected in a loop to form a divide-by-two divider. Similarly four TSP spot circuits can be electrically connected in a loop to form a divide-by-four divider.

Additional details of the TSP spot divider 100 can be as described earlier.

FIGS. 2A-2E are schematic diagrams of TSP spot circuits according to various embodiments.

Figure 2A:
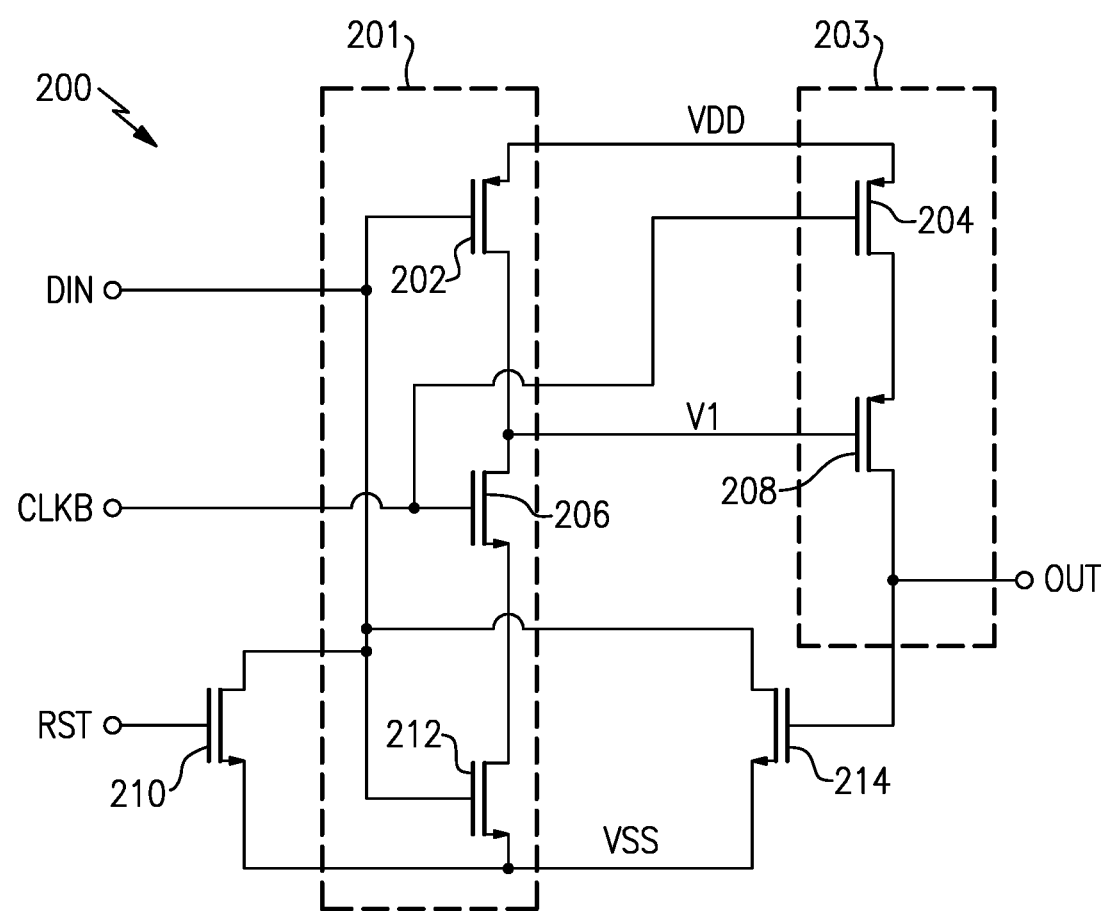
FIGS. 2A-2E are schematic diagrams of TSP spot circuits according to various embodiments.

FIG. 2A is a schematic diagram of a TSP spot circuit 200 according to one embodiment. The TSP spot circuit 200 includes a first or input stage 201 and a second or output stage 203. The first stage 201 includes an input PMOS or first input FET 202, a clock NMOS or first clock FET 206, and an input NMOS or second input FET 212. Additionally, the second stage 203 includes a clock PMOS or second clock FET 204, and an output PMOS or output FET 208. The TSP spot circuit 200 further includes a reset NMOS or reset FET 210 and a feedback NMOS or feedback FET 214.

Although one specific embodiment using metal oxide semiconductor (MOS) transistors is shown, the teachings are applicable to configurations using other types of field-effect transistors (FETs).

The input PMOS 202 has a source electrically connected to a first supply node VDD and a drain electrically connected to a first signal node V1. The clock NMOS 206 and the input NMOS 212 are electrically connected in series between the first signal node V1 and a second supply node VSS. The clock NMOS 206 has a drain electrically connected to the first signal node V1 and a source electrically connected to a drain of the input NMOS 212. A source of the input NMOS 212 is electrically connected to the second supply node VSS. A data input or spot input DIN is electrically connected to a gate of the input PMOS 202 and to a gate of the input NMOS 212, while a clock input CLKB is electrically connected to a gate of the clock NMOS 206.

The clock PMOS 204 and the output PMOS 208 are electrically connected in series between the first supply node VDD and a data output or spot output OUT. The clock PMOS 204 has a source electrically connected to the first supply node VDD and a drain electrically connected to a source of the output PMOS 208. The data output OUT is electrically connected to a drain of the output PMOS 208. A gate of the output PMOS 208 is electrically connected the first signal node V1, and a gate of the clock PMOS 204 is electrically connected to the clock input CLKB.

The reset NMOS 210 has a drain electrically connected to the data input DIN, a source electrically connected to the second supply node VSS, and a gate electrically connected to a reset input RST. The feedback NMOS 214 has a drain electrically connected to the data input DIN, a source electrically connected to the second supply node VSS, and a gate electrically connected to the data output OUT.

The second stage 203 can either provide low impedance between the first supply node VDD to the data output OUT or provide high impedance so as to electrically insulate the data output OUT from the first supply node VDD. When the data input DIN receives a logic low input signal, the input PMOS 202 turns on and conducts so that the first signal node V1 is controlled to a logic high level. In turn, the output PMOS 208 is turned off such that the second stage 203 electrically insulates the data output OUT from the first supply node VDD. Therefore, regardless of the state of a clock signal at the clock input CLKB, when the data input DIN receives an input signal having a logic low level (indicating that a spot is not present at the data input DIN), the second stage 203 provides high impedance between the data output OUT and the first supply node VDD.

However, when the data input DIN receives an input signal having a logic high level (indicating that a spot is present at the data input DIN), the TSP spot circuit 200 can dynamically transmit the logic high level from the data input DIN to the data output OUT in response to a falling edge of the clock signal. Thus, the spot is passed from the data input DIN to the data output OUT on a falling edge of the clock signal in this embodiment.

For example, when the spot is present, both the data input DIN and the clock input CLKB can have high logic levels after the clock signal rises. Thus, in response to a rising edge of the clock signal, a low impedance path is provided from the second supply node VSS to the first signal node V1 through the input NMOS 212 and the clock NMOS 206, thereby turning on the output PMOS 208. When the clock signal thereafter falls, the clock PMOS 204 turns on, and a low impedance path is provided from the first supply node VDD to the output node OUT, thereby pulling the data output OUT high. Thus, the TSP spot circuit 200 passes the spot from the data input DIN to the data output OUT in response to a falling edge of the clock signal.

Additionally, the illustrated embodiment advantageously includes the feedback NMOS 214, which clears the spot from the data input DIN once the spot reaches the data output OUT. In particular, the feedback NMOS 214 turns on in response to a rising edge of the data output OUT, thereby providing a low impedance path from the second supply node VSS to the data input DIN and clearing the spot from the data input DIN.

Thus, the feedback NMOS 214 operates as a feedback element with respect to the embodiment shown in FIG. 1. After a falling clock edge causes the data output OUT to transition to a logic high level, the data output OUT controls the gate of the feedback NMOS 214 such that the feedback NMOS 214 conducts. In turn the data input DIN is charged to a logic low level by the feedback NMOS 214, thereby removing the spot from the data input DIN. In this way, during a single clock cycle, the TSP spot circuit 200 transmits the logic high level at the data input DIN to the data output OUT and then charges the data input DIN to the logic low level.

Accordingly, the illustrated TSP spot circuit 200 holds a spot for about one clock cycle. Holding the spot for about one clock cycle can relax timing constraints relative to a configuration in which a spot is held for only a fraction of a clock cycle. For instance, certain multiphase spot circuits can hold a spot for about a half clock cycle. The TSP spot circuit 200 can operate with a shorter minimum clock period and corresponding higher maximum operating frequency relative to such multiphase spot circuits.

In one embodiment, a TSP spot circuit holds a spot for between 80% and 100% of a clock cycle when operating over 1 GHz. This, in turn, can advantageously simplify or relax a design using the TSP spot circuit as compared to a spot circuit which holds a spot for between 40% and 60% of a clock cycle; and more importantly, can allow for improved clock rates. For instance, a TSP spot circuit that holds a spot between 80% and 100% of a clock cycle can operate with 30% faster performance compared to a spot circuit that holds a spot between 40% and 60% of clock cycle.

The illustrated TSP spot circuit 200 also includes the reset NMOS 210, which can be used to asynchronously reset the TSP spot circuit 200 by clearing the spot from the data input DIN. Although the illustrated configuration includes the reset NMOS 210, other configurations are possible. For example, in another embodiment, the reset NMOS 210 can be omitted. In yet another embodiment, the reset NMOS 210 is included in series with a clocked FET to provide a synchronous reset. In yet another embodiment, set and/or reset functionality is provided in other ways, such as by using an asynchronous set and/or a synchronous set.

Additional details of the TSP spot circuit 200 can be as described earlier.

Figure 2B:
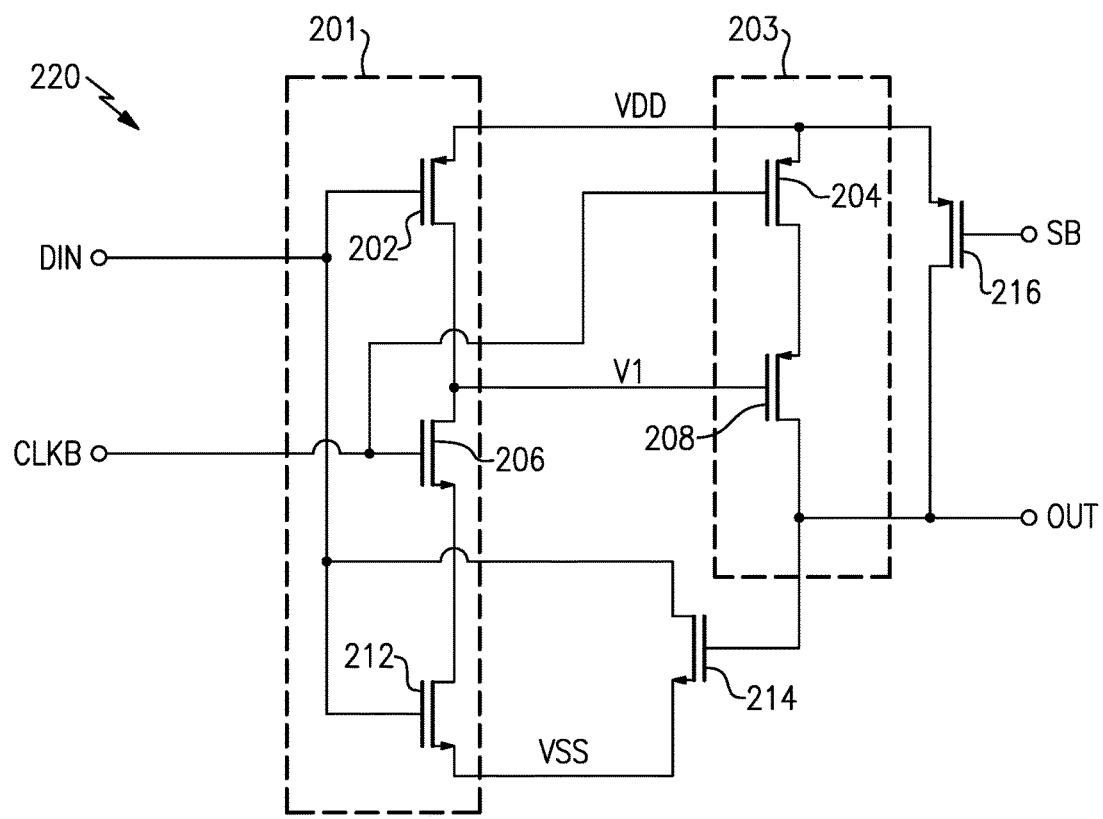

FIG. 2B is a schematic diagram of a TSP spot circuit 220 according to another embodiment. The TSP spot circuit 220 of FIG. 2B is similar to the TSP spot circuit 200 of FIG. 2A, except that TSP spot circuit 220 omits the reset NMOS 210 in favor of including a set PMOS 216.

As shown in FIG. 2B, the set PMOS 216 has a source electrically connected to the first supply node VDD, a drain electrically connected to the data output OUT, and a gate that receives a set signal SB. The set PMOS 216 provides set functionality that charges the data output OUT to a logic high level when the set signal SB at the gate of the PMOS 216 is logically low.

Additional details of the TSP spot circuit 220 can be as described earlier.

Figure 2C:
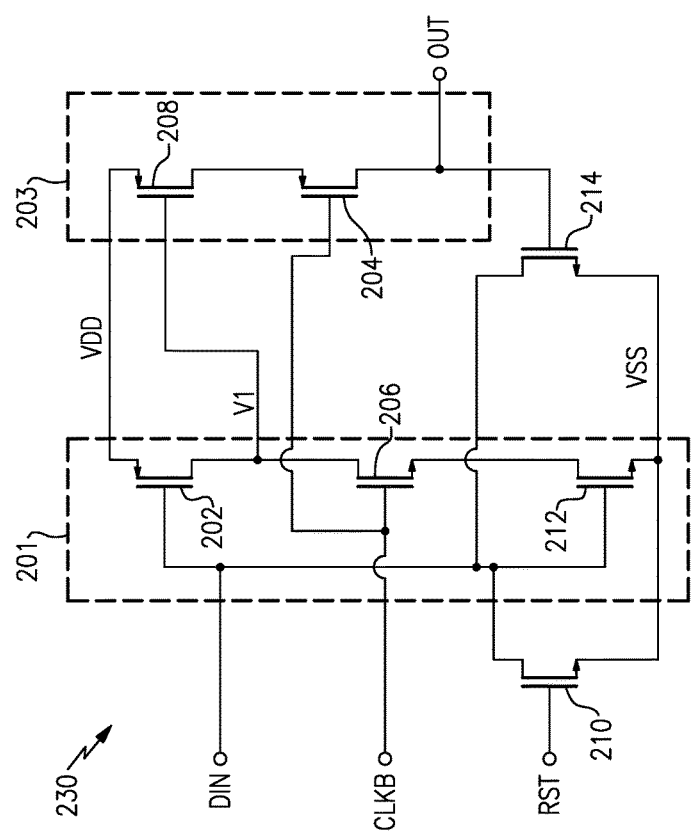

FIG. 2C is a schematic diagram of a TSP spot circuit 230 according to another embodiment. The TSP spot circuit 230 of FIG. 2C is similar to the TSP spot circuit 200 of FIG. 2A, except that the order in the series of the clock PMOS 204 and the output PMOS 208 is reversed in the embodiment shown in FIG. 2C relative to the embodiment shown in FIG. 2A. In particular, the clock PMOS 204 of FIG. 2C includes a drain electrically connected to the data output OUT and a source electrically connected to a drain of the output PMOS 208, and the output PMOS 208 of FIG. 2C includes a source electrically connected to the first supply node VDD.

Reversing the order in the series of the clock PMOS 204 and the output PMOS 208 can increase operating speed by decreasing the delay in passing the spot from the data input DIN to the data output OUT in response to a falling clock edge. However, configuring the TSP spot circuit 230 in this manner also increases clock feed-through.

Additional details of the TSP spot circuit 230 can be as described earlier.

Figure 2D:
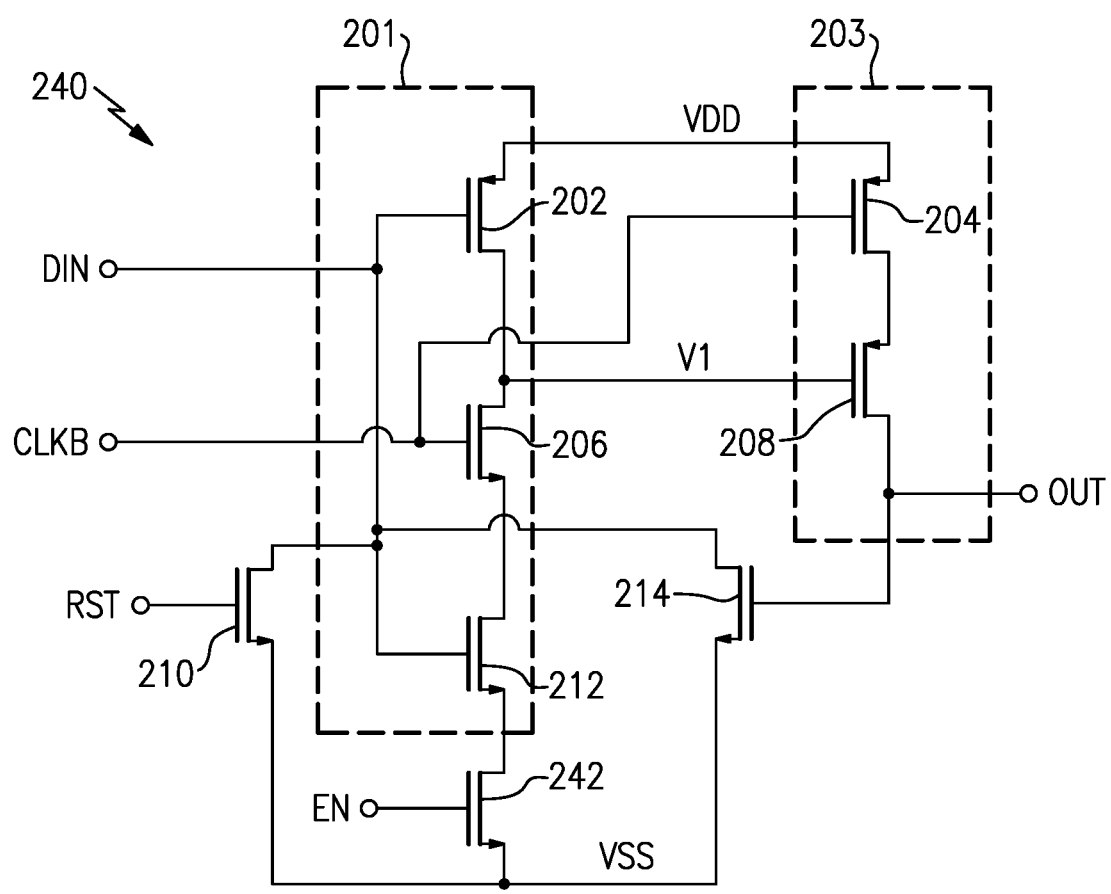

FIG. 2D is a schematic diagram of a TSP spot circuit 240 according to another embodiment. The TSP spot circuit 240 of FIG. 2D is similar to the TSP spot circuit 200 of FIG. 2A, except that the TSP spot circuit 240 further includes an enable NMOS 242 electrically connected in series with the clock NMOS 206 and the input NMOS 212 between the first signal node V1 and the second supply node VSS. In the illustrated embodiment, the enable NMOS 242 has a drain electrically connected to the source of the input NMOS 212, a source electrically connected to the second supply node VSS, and a gate electrically connected to an enable input EN.

The enable NMOS 242 provides enable functionality to the TSP spot circuit 240 such that the enable NMOS 242 enables circuit operation when the enable input EN is high and disables circuit operation when the enable input EN is low. For example, as shown in FIG. 2D, the enable NMOS 242 operates in an electrical path of the first stage 201 between the first signal node V1 and the second supply node VSS. When the enable input EN is logically low, the enable NMOS 204 turns off and operates an open circuit that prevents the first stage 201 from turning on the output PMOS 208 in response to a rising edge of the clock signal. In contrast, when the enable input EN is high, the enable NMOS 242 electrically connects the source of the input NMOS 212 to the second supply node VSS, thereby enabling operation.

Additional details of the TSP spot circuit 240 can be as described earlier.

Figure 2E:
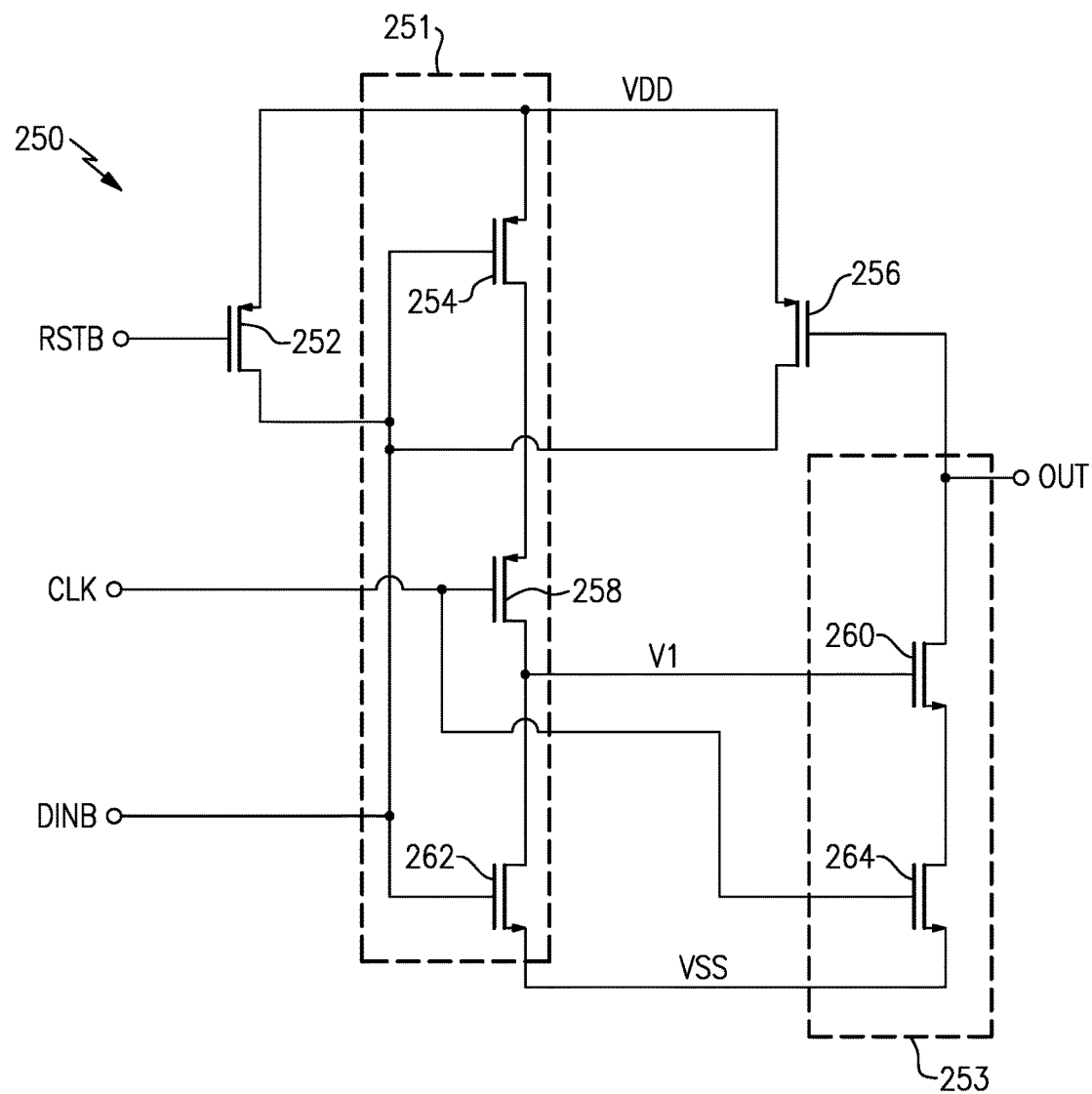

FIG. 2E is a schematic diagram of a TSP spot circuit 250 according to another embodiment. The TSP spot circuit 250 includes a first or input stage 251 and a second or output stage 253. The first stage 251 includes an input NMOS or first input FET 262, a clock PMOS or first clock FET 258, and an input PMOS or second input FET 254. Additionally, the second stage 253 includes a clock NMOS or second clock FET 264, and an output NMOS or output FET 260.

The TSP spot circuit 250 further includes a reset PMOS or reset FET 252 and a feedback PMOS or feedback FET 256.

The TSP spot circuit 250 of FIG. 2E illustrates one embodiment of a TSP spot circuit that operates using a spot represented using a logical zero. The TSP spot circuit 250 of FIG. 2E corresponds to a complementary implementation of the TSP spot circuit of FIG. 2A, in which a polarity of the transistors is reversed and the first and second supply nodes are flipped. As persons having ordinary skill in the art will appreciate, complementary implementations of the TSP spot circuits of FIGS. 2B-2D having a logic low spot can also be realized in a similar manner.

The logic operation of the TSP spot circuit 250 of FIG. 2E can be complementary to that of the TSP spot circuit 200 of FIG. 2A. For example, like the TSP spot circuit 200 of FIG. 2A, the TSP spot circuit 250 of FIG. 2E can transmit a spot. However, in contrast to the TSP spot circuit 200 that transmits a spot having a logic high state, the TSP spot circuit 250 transmits a spot having a logic low state. Additionally, the TSP spot circuit 250 of FIG. 2E transmits the spot from the data input DINB to the data output OUT on a rising edge of a clock signal received on the clock input CLK. In contrast, the TSP spot circuit 200 of FIG. 2A transmits a spot on a falling edge of a clock signal.

Thus, the TSP spot circuit 250 of FIG. 2E is complementary to that of the TSP spot circuit 200 of FIG. 2A. The TSP spot circuit 250 of FIG. 2E includes transistors of opposite device polarity and supply nodes that are reversed or flipped relative to the TSP spot circuit 200 of FIG. 2A.

As shown in FIG. 2E, the input NMOS 262 has a source electrically connected to the first supply node VSS and a drain electrically connected to the first signal node V1. Additionally, the input PMOS 254 and the clock PMOS 258 are electrically connected in series between the first signal node V1 and the second supply node VDD. The clock PMOS 258 has a drain electrically connected to the first signal node V1 and a source electrically connected to a drain of the input PMOS 254. A source of the input PMOS 254 is electrically connected to the second supply node VDD. A data input or spot input DINB is electrically connected to a gate of the input NMOS 262 and to a gate of the input PMOS 254, and a clock input CLK is electrically connected to a gate of the clock PMOS 258.

The output NMOS 260 and the clock NMOS 264 are electrically connected in series between the first supply node VSS and the data output or spot output OUT. The NMOS 264 has a source electrically connected to the first supply node VSS and a drain electrically connected to a source of the output NMOS 260. The data output OUT is electrically connected to a drain of the output NMOS 260. A gate of the output NMOS 260 is electrically connected the first signal node V1, and a gate of the clock NMOS 264 is electrically connected to the clock input CLK.

The reset PMOS 252 has a drain electrically connected to the data input DINB, a source electrically connected to the second supply node VDD, and a gate electrically connected to a reset input RSTB. The feedback PMOS 256 has a drain electrically connected to the data input DINB, a source electrically connected to the second supply node VDD, and a gate electrically connected to the data output OUT.

When the data input DINB receives a logic high input signal (indicating that a spot is not present at the data input DINB), the input NMOS 262 conducts so that the first signal node V1 is a logic low. In turn, the output NMOS 260 is turned off to operate as an open circuit so that the second stage 253 electrically insulates the data output OUT from the first supply node VSS. Therefore, regardless of the state of a clock signal at the clock input CLK, when the data input DINB receives an input signal having a logic high level, the second stage 253 provides high impedance between the data output OUT and the first supply node VSS.

However, when the data input DINB receives an input signal having a logic low level (indicating that a spot is present at the data input DINB), the TSP spot circuit 250 can dynamically transmit the logic low level from the data input DIN to the data output OUT in response to a rising edge of the clock signal. Thus, the spot is passed from the data input DINB to the data output OUT on a rising edge of the clock signal in this embodiment.

For example, when the spot is present, both the data input DINB and the clock input CLK can have low logic levels after the clock signal falls. Thus, in response to a falling edge of the clock signal, a low impedance path is provided from the second supply node VDD to the first signal node V1 through the input PMOS 254 and the clock PMOS 258, thereby turning on the output NMOS 260. When the clock signal thereafter rises, the clock NMOS 264 turns on, and a low impedance path is provided from the first supply node VSS to the output node OUT, thereby pulling the data output OUT low. Thus, the TSP spot circuit 250 passes the spot from the data input DINB to the data output OUT in response to a rising edge of the clock signal.

The feedback PMOS 256 operates as a feedback element. In particular, after a rising clock edge causes the data output OUT to transition to a logic low level, the feedback PMOS 256 conducts to charge the data input DINB to a logic high level, thereby clearing the spot from the input.

The reset PMOS 252 can be used to reset the data input DINB to a logic high level by providing a pulse to the reset input RSTB, thereby clearing the spot from the input.

Additional details of the TSP spot circuit 250 can be as described earlier.

Figure 3A:
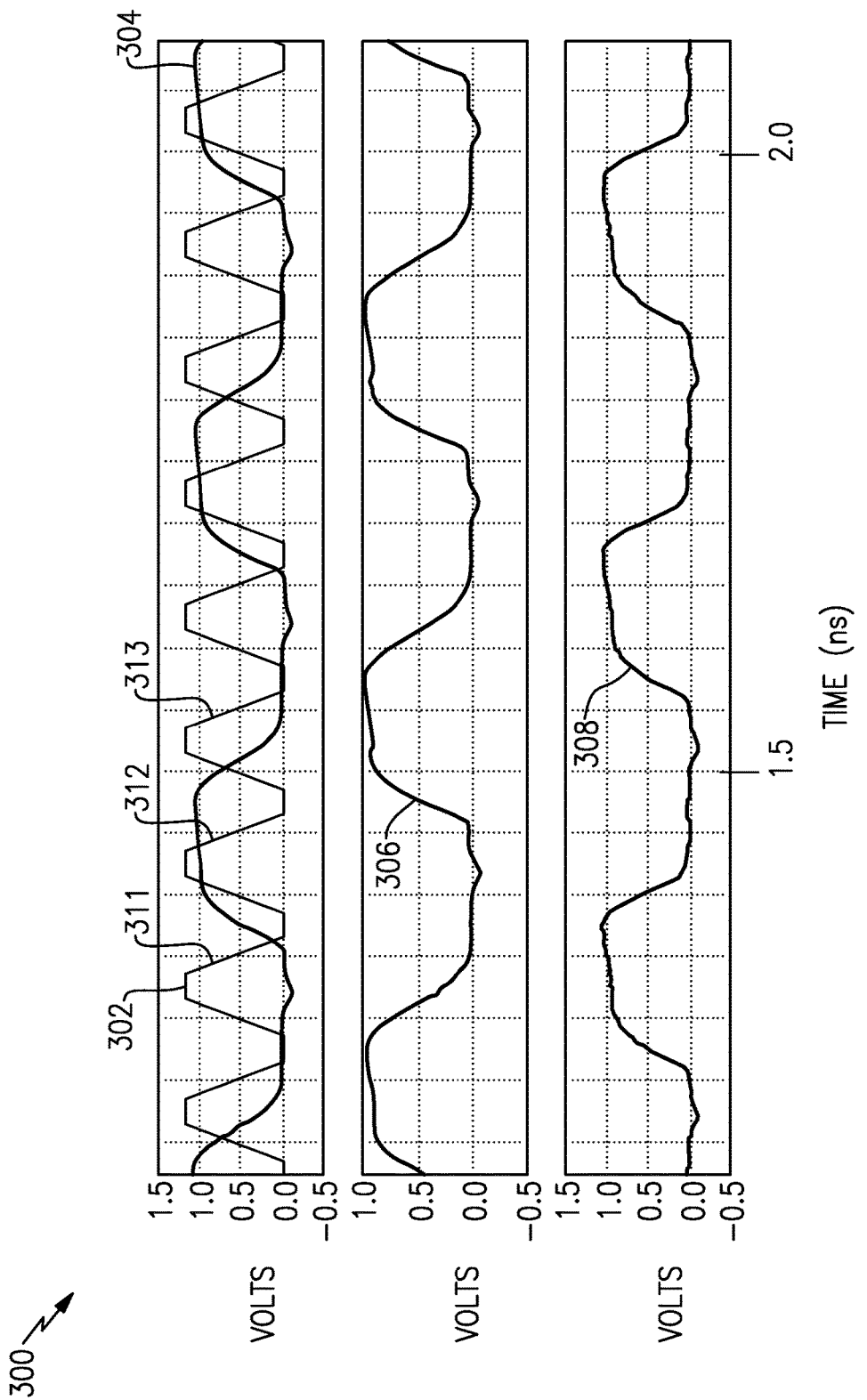
FIG. 3A is one example of a plot of simulated waveforms for the TSP spot divider of FIG. 1.

FIG. 3A is one example of a plot 300 of simulated waveforms for the TSP spot divider 100 of FIG. 1. The plot 300 includes a single phase clock input signal waveform 302 having rising and falling clock edges. In addition the plot 300 includes a first spot signal waveform 304, a second spot signal waveform 306, and a third spot signal waveform 308, corresponding to waveforms at the signal nodes VA, VB, and VC, respectively, of the TSP spot divider 100 of FIG. 1.

As shown in FIG. 3A, each of the TSP spot circuits 104, 106, 108 of FIG. 1 holds the spot for about one clock cycle. Additionally, the TSP spot circuits of FIG. 1 move the spot in response to a falling clock edge.

For example, as shown in FIG. 3A, the first spot signal waveform 304 transitions to a logic high state in response to a first falling clock edge 311 of a first clock cycle. After the first spot signal waveform 304 at the signal node VA reaches the logic high level, the third spot signal waveform 308 at the signal node VC transitions to a logic low level during the first clock cycle. The transition of the third spot signal waveform 308 to a logic low state corresponds to the feedback element of the first TSP spot circuit 104 of FIG. 1 charging the signal node VC to a logic low level.

Similarly, the second spot signal waveform 306 transitions to a logic high state in response to a second falling clock edge 312 of a second clock cycle. Thereafter, during the second clock cycle, the first spot signal waveform 304 transitions to a logic low level. This corresponds to when the second TSP spot circuit 106 charges the signal node VB to a logic high level, and thereafter charges the signal node VA to a logic low level via a feedback element.

Furthermore, the third spot signal waveform 308 transitions to a logic high state in response to a third falling clock edge 313 of a third clock cycle. Thereafter, during the third clock cycle, the third spot signal waveform 308 transitions to a logic low level. This corresponds to when the third TSP spot circuit 108 charges the signal node VC to a logic high level, and thereafter charges the signal node VB to a logic low level via a feedback element.

Figure 3B:
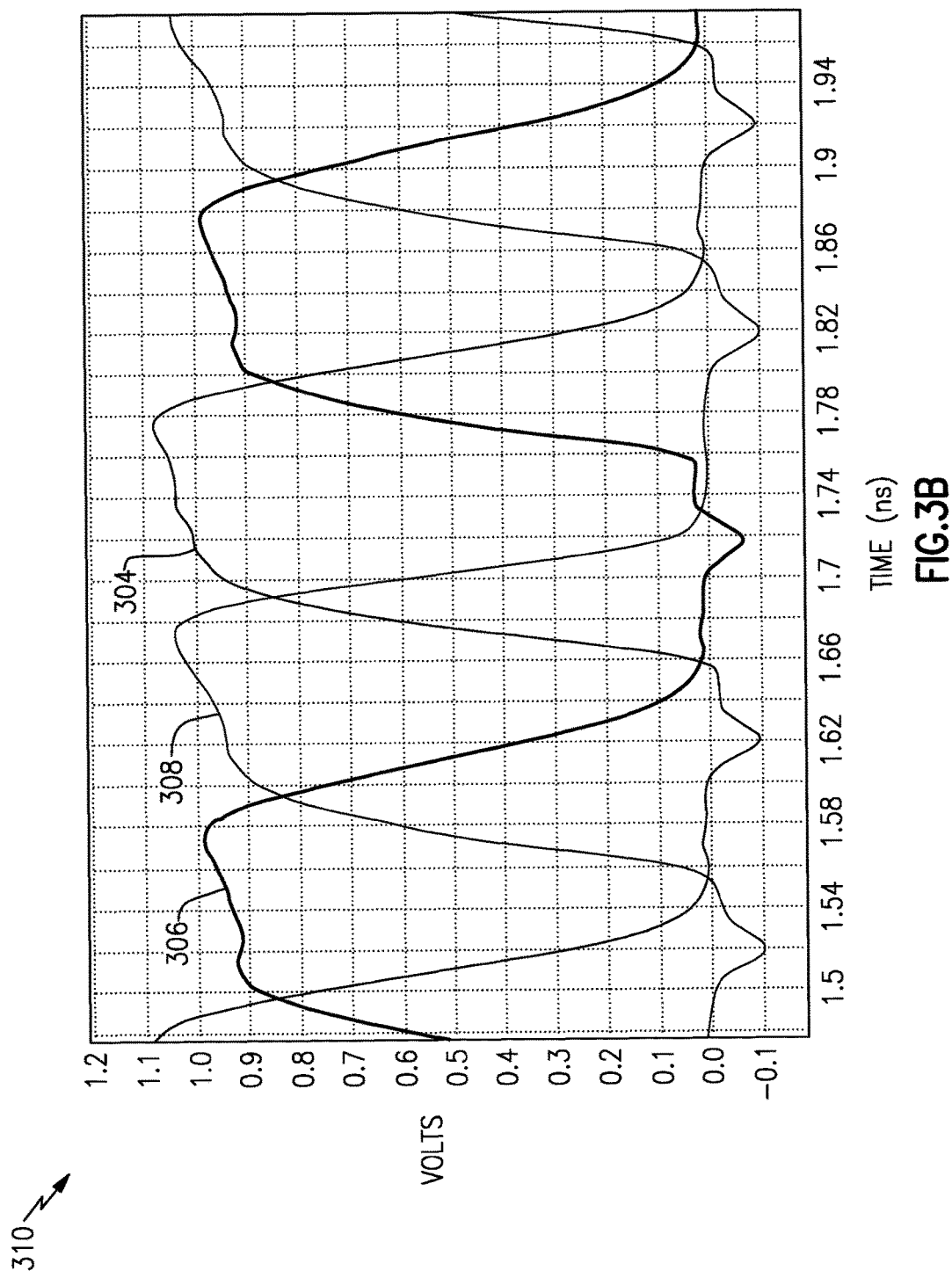
FIG. 3B is another example of a plot of simulated waveforms for the TSP spot divider of FIG. 1.

FIG. 3B is another example of a plot 310 of simulated waveforms for the TSP spot divider 100 of FIG. 1. The plot 310 includes a portion of the spot signal waveforms 304, 306, 308 of FIG. 3A superimposed on top of one another. As discussed with respect to FIG. 3A, each of the spot signal waveforms 304, 306, 308 remains in a spot state for about one clock cycle. Also, each spot overlaps such that the successive spot changes to the spot state, the logic high state, before its preceding spot transitions to a logic low. For instance, as shown in FIG. 3B, the spot signal waveform 304 at signal node VA rises to the logic high state before the spot signal waveform 308 at signal node VC falls to the logic low state.

Although FIGS. 3A and 3B illustrate two examples of simulated waveforms for the spot divider 100 of FIG. 1, other results are possible. For example, a spot divider's operation can vary with implementation and/or application.

Figure 4:
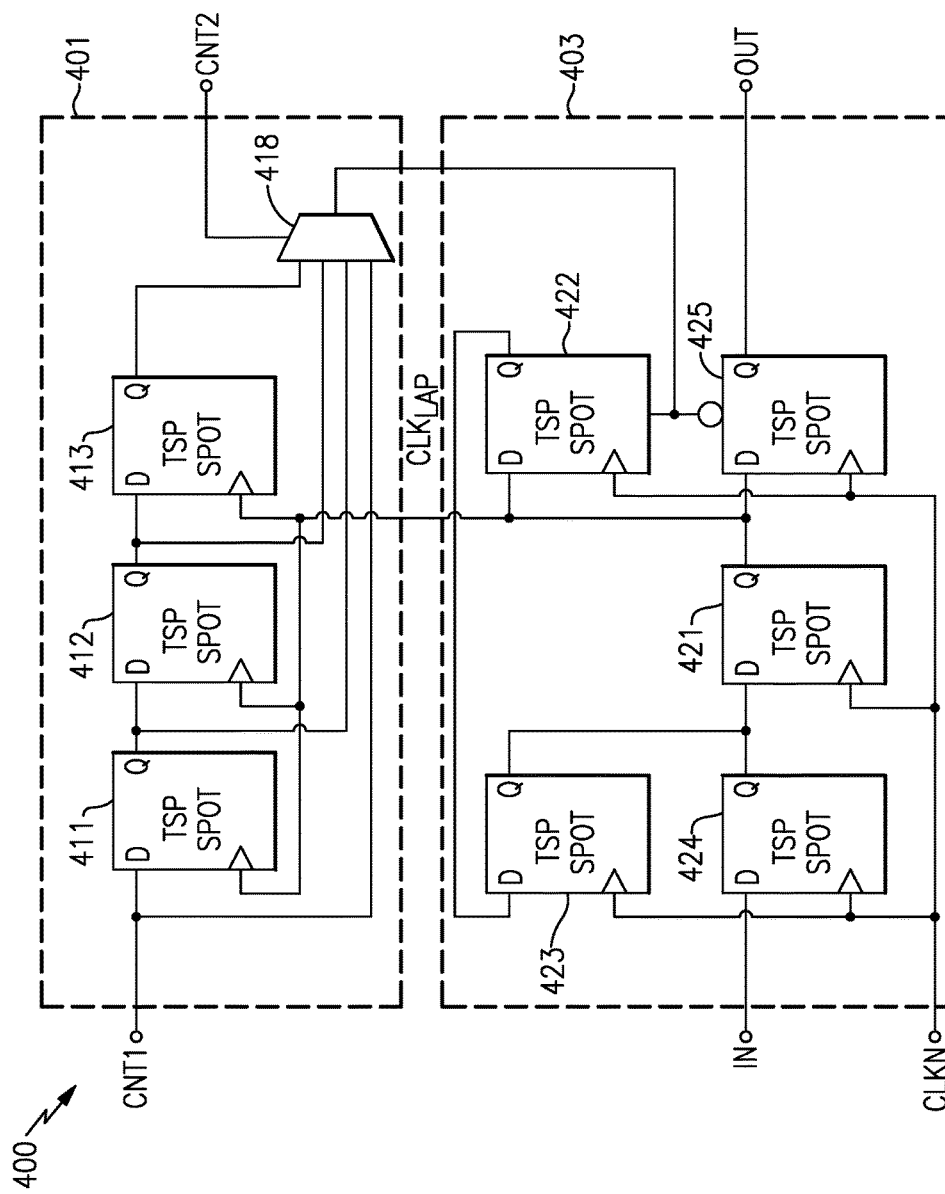
FIG. 4 is a schematic diagram of a TSP spot divider according to another embodiment.

FIG. 4 is a schematic diagram of a TSP spot divider 400 according to another embodiment. The TSP spot divider 400 includes an outer divider circuit 401 including a first outer TSP spot circuit 411, a second outer TSP spot circuit 412, a third outer TSP spot circuit 413, and a multiplexer (MUX) 418. The TSP spot divider 400 further includes an inner divider circuit 403 including a first inner TSP spot circuit 421, a second inner TSP spot circuit 422, a third inner TSP spot circuit 423, a spot loading TSP spot circuit 424 and a spot removing TSP spot circuit 425.

Although the illustrated outer divider circuit 401 includes three TSP spot circuits and one multiplexer, other configurations are possible. For example, the outer divider circuit 401 can include more or fewer TSP spot circuits to achieve a desired factor of frequency division. In another embodiment, the outer divider circuit omits TSP spot circuits in favor of implementing the outer divider using complex logic. Additionally, although the illustrated input divider circuit 403 includes three inner TSP spot circuits in a ring, one spot loading TSP spot circuit, and one spot removing TSP spot circuit, other configurations are possible. For example, the input divider circuit 402 can include more or fewer inner TSP spot circuits in a ring and/or can include other configurations of spot loading, spot removing, and/or state initialization.

Each of the TSP spot circuits has a data input D, a data output Q, and a clock input. The second inner TSP spot circuit 422 further includes an enable input and the spot removing TSP spot circuit 425 further includes an enable bar input.

The outer TSP spot circuits 411-413 are electrically connected in a cascade. The data output Q of the first outer TSP spot circuit 411 is electrically connected to the data input D of the second outer TSP spot circuit 412, and the data output Q of the second outer TSP spot circuit 412 is electrically connected to the data input D of the third outer TSP spot circuit 413. The data output Q of the third outer TSP spot circuit 413 is electrically connected to a first input of the MUX 418. A second input and a third input of the MUX 418 are electrically connected to the data output Q of the second outer TSP spot circuit 412 and to the data output Q of the first outer TSP spot circuit 411, respectively. The fourth input of the MUX 418 is electrically connected to a first control signal CNT1, which also serves as the data input D to the first outer TSP spot circuit 411. As shown in FIG. 4, the clock inputs of the outer TSP spot circuits 411-413 are controlled by a lap clock signal $CLK_{LAP}$, which is generated by the data output Q of the first inner TSP spot circuit 421.

The MUX 418 includes a control input that receives a second control signal CNT2. The MUX 418 further includes an output electrically connected to the enable input of the second inner TSP spot circuit 422 and to the enable bar input of the spot removing TSP spot circuit 425.

The inner TSP spot circuits 421-423 are electrically connected in a ring. Additionally, the spot loading TSP spot circuit 424 is used to load a spot from a spot input IN into the ring of inner TSP spot circuits 421-423, and the spot removing TSP spot circuit 425 is used to remove the spot from the ring and to provide the spot to a spot output OUT. As shown in FIG. 4, the inner TSP spot circuits 421-423, the spot loading TSP spot circuit 424, and the spot removing TSP spot circuit 425 each include a clock input that receives a single phase clock signal CLKN.

As shown in FIG. 4, the data output Q of the first inner TSP spot circuit 421 is electrically connected to the data input D of the second inner TSP spot circuit 422 and to the data input D of the spot removing TSP spot circuit 425 at a node that generates the lap clock signal $CLK_{LAP}$. Additionally, the data output Q of the second inner TSP spot circuit 422 is electrically connected to the data input D of the third inner TSP spot circuit 423. Furthermore, the data output Q of the third inner TSP spot circuit 423 is electrically connected to the data input D of the first inner TSP spot circuit 421. The data input D of the spot loading TSP spot circuit 424 receives the spot input IN, and the data output Q of the spot loading TSP spot circuit 424 is electrically connected to the data input D of the first inner TSP spot circuit 421. The data input D of the spot removing TSP spot circuit 425 is electrically connected to the data output Q of the first inner TSP spot circuit 421, and the data output Q of the spot removing TSP spot circuit 425 generates the spot output signal OUT.

The TSP spot divider 400 divides the single phase clock signal CLKN using the inner divider circuit 403 and the outer divider circuit 401. Additionally, the amount of division provided by the TSP spot divider 400 is controllable using the first control input CNT1 and the second control input CNT2. Therefore, the frequency can be controlled by the first control input CNT1 and the second control input CNT2; and in contrast to the TSP spot divider 100 of FIG. 1 that provides division with a fixed divisor, the TSP spot divider 400 of FIG. 4 advantageously provides division using a selectable division value. Implementing a divider with a selectable division value is beneficial for a wide variety of applications, including, for example, frequency synthesizer applications.

The spot input IN, the first control input CNT1, and the second control input CNT2 can be used to control the inner divider circuit 403 and the outer divider circuit 401, thereby controlling the TSP spot divider's division value. For example, the spot loading TSP spot circuit 424 is used to load a spot from the spot input IN into the ring of inner TSP spot circuits 421-423. The spot is moved around the ring of inner TSP spot circuits 421-423 based on timing of the single phase clock signal CLKN. Since the ring of inner TSP spot circuits 421-423 includes three TSP spot circuits, the lap clock signal $CLK_{LAP}$ has a frequency that is about one-third that of the single phase clock signal CLKN when a spot is present in the inner ring. The outer divider circuit 401 is used to control a timing of when the spot is removed from the ring of inner TSP spot circuits 421-423 to the spot output OUT, thereby controlling the value of the TSP spot divider's divisor.

Accordingly, the rate at which the spot appears at the spot output OUT corresponds to the division rate of the TSP spot divider 400. As shown in FIG. 4, the outer divider circuit 401 is used to control timing of when the spot is removed from the ring of inner TSP spot circuits 421-423 to the spot output OUT using the spot removing TSP spot circuit 425. In particular, the output of the MUX 418 controls the enable and enable bar inputs of the second inner TSP spot circuit 422 and the spot removing TSP spot circuit 425, and thus can be used to either remove the spot from the inner ring to the spot output OUT or to allow the spot to take another lap around the inner ring.

In one example, to achieve a division rate of 2 using the TSP spot circuit 400, a spot can be moved from the input of the first inner TSP spot circuit 421 to the input of the spot removing TSP spot circuit 425 on a first clock cycle, and then from the input of the spot removing TSP spot circuit 425 to the spot output OUT on a second clock cycle. Thus, when dividing by a factor of 2, the TSP spot divider 400 can provide a spot on the spot output OUT every other cycle of the single phase clock signal CLKN.

In another example, a division rate of 5 can be achieved by moving a spot from the first inner TSP spot circuit's input to output on a first clock cycle, by moving the spot from the second inner TSP spot circuit's input to output on a second clock cycle, by moving the spot from the third inner TSP spot circuit's input to output on a third clock cycle, by moving the spot from the first inner TSP spot circuit's input to output on a fourth clock cycle, and by moving the spot from the spot removing TSP spot circuit's input to output on a fifth clock cycle.

To provide a particular divisor, timing of providing a spot at the spot input IN is controlled. Additionally, to provide large division rates, a control spot can be provided on the first control input CNT1. The control spot can be moved through the outer TSP spot circuits 411-413 based on timing of the lap clock signal $CLK_{LAP}$, which has a frequency that is about one-third of the single phase clock signal CLKN in this example. The second control input CNT2 can be used to control the MUX 418 and thus timing of when the control spot reaches the enable bar input of the spot removing TSP spot circuit 425.

With reference back to FIG. 1, the TSP spot divider 100 provides frequency division with a divisor equal to a number of TSP spot dividers that are electrically connected in a ring. Thus, N TSP spot divisors can be electrically connected in a ring to achieve frequency division with a divisor N. Although a ring of TSP spot dividers can be used to achieve a desired amount of frequency division, such a configuration can have a relatively high cost, power, and/or size when the divisor is relatively large, since the number of TSP spot dividers can scale linearly with the divisor N.

In contrast, the number of TSP spot dividers of the single phase spot divider 400 scales logarithmically with the divisor N. In particular, including k outer TSP spot circuits in the outer divider circuit 401 increases the divisor N by a factor of $2^k$, and thus the number of outer TSP spot circuits grows as log(N). Thus, the illustrated TSP spot divider 400 of FIG. 4 can provide frequency division using a fewer number of TSP spot circuits relative to the TSP spot divider 100 of FIG. 1.

Although the embodiment of the TSP spot divider 400 shows a total of eight TSP spot circuits, other configurations having greater or fewer TSP spot circuits can be realized for TSP spot dividers having different divisors.

Figure 5:
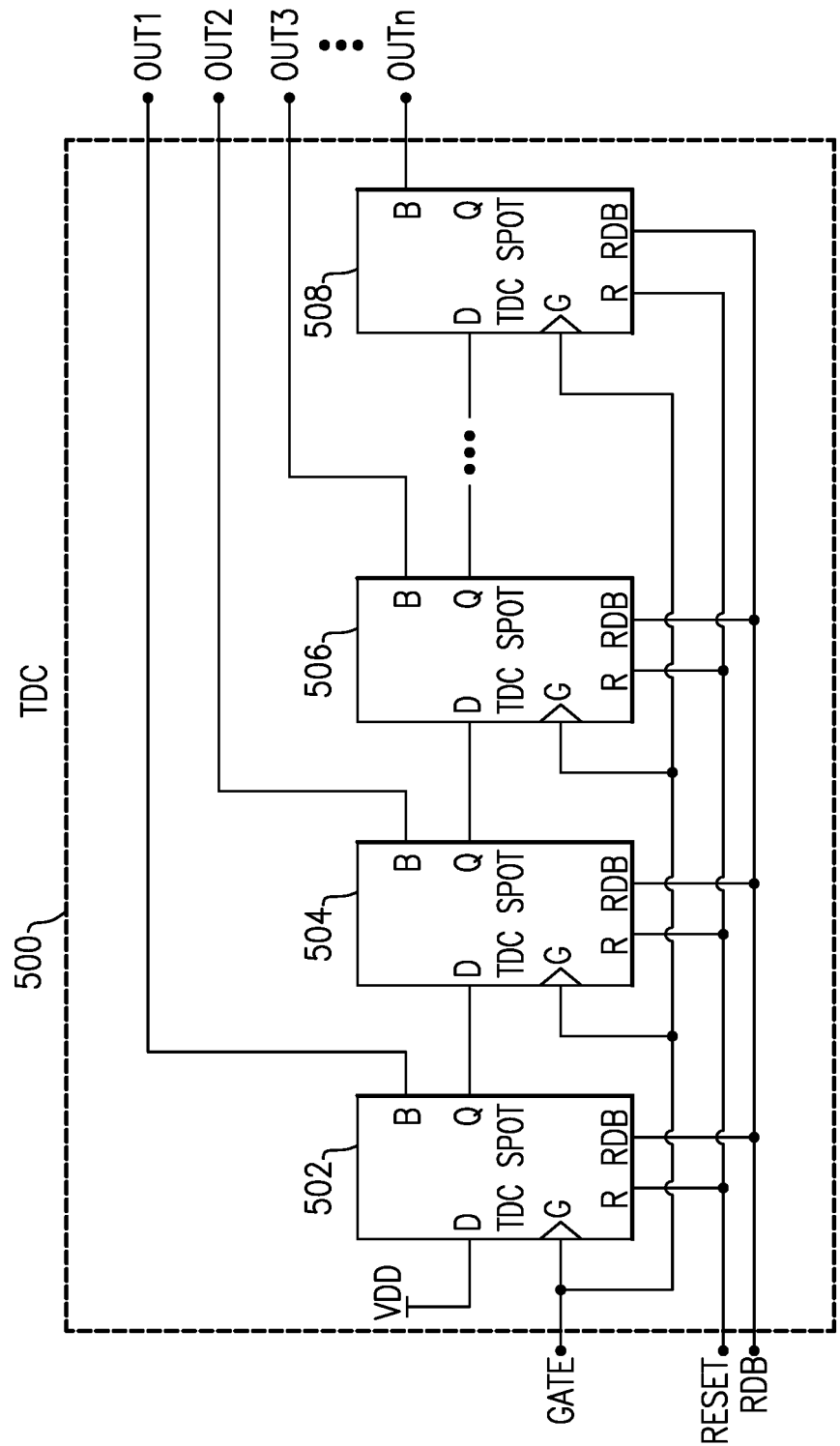
FIG. 5 is a schematic diagram of a time to digital converter (TDC) according to one embodiment.

FIG. 5 is a schematic diagram of a time to digital converter (TDC) 500 according to one embodiment. The TDC 500 includes a first TDC spot circuit 502, a second TDC spot circuit 504, a third TDC spot circuit 506, and a fourth TDC spot circuit 508 electrically connected in a cascade.

Although the illustrated embodiment includes four TDC spot circuits in a cascade, other numbers of TDC spot circuits can be used. In one embodiment, a TDC can include between 8 and about 1024 or greater TDC spot circuits in a cascade. Providing a cascade of a relatively large number of TDC spot circuits allows a TDC to generate a digital representation of a pulse of relatively long duration.

The TDC 500 uses spot circuits, referred to herein as TDC spot circuits, which are similar in certain respects to the TSP spot circuits of FIGS. 2A-2E. However, unlike the TSP spot circuits of FIGS. 2A-2E, the TDC spot circuits of FIG. 5 are implemented to measure a pulse width of a gating or clock signal G. In certain implementations, the TDC spot circuits can operate without a feedback element, and thus the spot is not cleared from a TDC spot circuit's input in these implementations.

As shown in FIG. 5, a data output Q of the first TDC spot circuit 502 is electrically connected to a data input D of the second TDC spot circuit 504. Additionally, a data output Q of the second TDC spot circuit 504 is electrically connected to a data input D of the third TDC spot circuit 506. Furthermore, a data output Q of the third TDC spot circuit 506 is electrically connected to a data input D of the fourth TDC spot circuit 508. As shown in FIG. 5, a data input D of the first TDC spot circuit 502 receives a logic high signal (corresponding to a spot in this example) through its connection to a first supply node VDD. Additionally, a first buffered output signal OUT1 is provided at a buffer output B of the first TDC spot circuit 502. Similarly second to fourth buffered output signals OUT2, OUT3, and OUTn are provided at a buffered output B of the second, third, and fourth TDC spot circuits 504, 506, 508, respectively. In certain configurations, the buffered output signals OUT1-OUTn are provided to a decoder or other digital processing circuitry.

As shown in FIG. 5 each of the TDC spot circuits has a gate or clock input G, a reset input R, a read buffer input RDB, a spot or data input D, a spot or data output Q, and a buffer output B. The gate input G of each of the TDC spot circuits receives a gate signal GATE, and the reset input R of each receives a reset signal RESET. Also, the read buffer input RDB of each of the TDC spot circuits receives a read buffer signal RDB.

The TDC 500 measures the time that the gate signal GATE is in a gating logic state. For instance, the TDC 500 can measure a pulse width of the gate signal GATE, such as the time that the gate signal GATE has a logic high level. In response to the start of a pulse of the gate signal GATE, a spot (logic high, in this example) flows from the data input D to the data output Q of the cascade of the TDC spot circuits starting with the first TDC spot circuit 502 and rippling down the chain of spots towards the fourth TDC spot circuit 508. The spot can ripple down the cascade of the TDC spot circuits until the end of the pulse of the gate or pulse signal GATE, which stops the spot from further propagating. Further, a digital representation of the gate signal's pulse time is determined by a state of the buffered outputs OUT1-OUTn.

Although FIG. 5 illustrates a configuration using a spot corresponding to a high logic level, the teachings herein are also applicable to configurations in which a spot is represented using a low logic level.

The TDC 500 provides buffered output data via the buffered outputs OUT1-OUTn. When the read buffer signal RDB is set to a read state, each buffered output provides the output state of the data output Q of a corresponding TDC spot circuit. For instance, when the second TDC spot circuit 504 provides a logic low at the data output Q, the buffered output OUT2 is low. Also, when the second TDC spot circuit 504 provides a logic high at the data output Q, the buffered output OUT2 is high.

Implementing each TDC spot circuit to include a buffered output B reduces loading effects on the data output Q, thereby reducing propagation delay through the TDC spot circuit and providing higher resolution. For instance, the illustrated configuration can have a time resolution that is based on a propagation delay of a spot through a TDC spot circuit. By reducing capacitive loading effects on the data outputs of the TDC spot circuits, a higher resolution can be achieved. The illustrated TDC 500 can achieve a resolution finer than that of a TDC implemented using CMOS inverters. For instance, the TDC 500 can have a resolution of about 27 ps or less, while a CMOS inverter-based TDC fabricated using a similar process can have a resolution of about 50 ps or more.

Resetting the TDC 500 is accomplished using the reset signal RESET. In particular, the reset signal RESET can be used to remove the spot from the illustrated TDC spot circuits, thereby clearing the state of the data output Q and the buffer output B of each TDC spot circuit. In one example, when the reset signal RESET is toggled high, the buffered outputs OUT1-OUTn can be cleared to logic low.

Although the TDC 500 of FIG. 5 is shown to have four TDC spot circuits, other configurations having fewer or greater TDC spot circuits are possible. Additionally, although the TDC 500 uses TDC spot circuits that transmit the logic high state and block the logic low state, other configurations are possible. For instance, a TDC can be realized using TDC spot circuits which transmit a logic low state and block a logic high state.

The TDC 500 can be used in a wide variety of applications. In one example, the TDC 500 is used in a PLL (for example, an all digital PLL) to control a digitally-controlled oscillator (DCO) based on a duration of an output pulse from a digital PFD. In another example, the TDC 500 is used in a positron emission tomography (PET) system to generate a digital representation of an amount of time between a burst of radiation and resulting positron emissions from biologically-active molecules.

Figure 6:
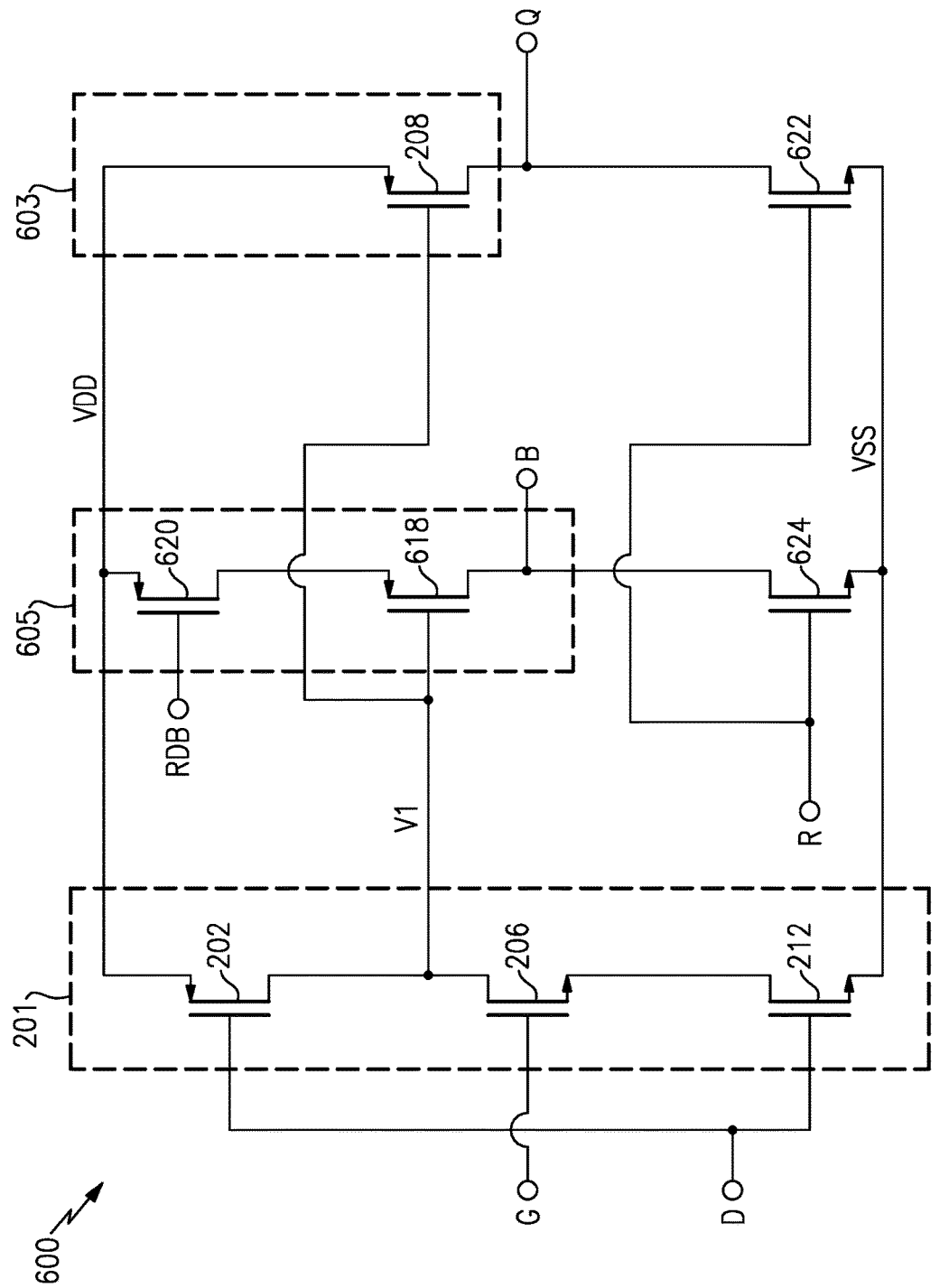
FIG. 6 is a schematic diagram of one embodiment of a TDC spot circuit.

FIG. 6 is a schematic diagram of one embodiment of a TDC spot circuit 600. The TDC spot circuit 600 includes a first or input stage 201, which can be as described earlier. The TDC spot circuit 600 further includes a second or output stage 603 including the output PMOS 208. The TDC spot circuit 600 further includes a third or buffered output stage 605 including a buffered output PMOS 618 and a read PMOS 620. The TDC spot circuit 600 further includes a first reset NMOS 622 and a second reset NMOS 624.

As discussed with respect to the TDC 500 of FIG. 5, the TDC 500 can be realized with the TDC spot circuits that omit a feedback element to reset the data input D after a spot (logic high in this example) is transmitted from the data input D to the data output Q. Accordingly, the illustrated TDC spot circuit 600 omits a feedback element.

The output PMOS 208 is electrically connected between the first supply node VDD and the output Q, and includes a gate electrically connected to the first signal node V1. Additionally, the buffered output PMOS 618 and the read PMOS 620 are electrically connected in series between the first supply node VDD and the buffered output B. As shown in FIG. 6, a gate of the buffered output PMOS 618 is electrically connected to the first signal node V1, and a gate of the read PMOS 620 is electrically connected to the read buffer input RDB. The first reset NMOS 622 is electrically connected between the data output Q and the second supply node VSS, and includes a gate electrically connected to the reset input R. The second reset NMOS 624 is electrically connected between the buffered output B and the second supply node VSS, and includes a gate electrically connected to the reset input R.

The TDC spot circuit 600 of FIG. 6 illustrates one embodiment of a TDC spot circuit that operates using a spot represented using a logical one. However, the teachings herein are also applicable to TDC spot circuits that operate using a spot represented using a logical zero. For example, in a manner similar to that described earlier with respect to the complementary TSP spot circuit 250 of FIG. 2E, complementary TDC spot circuits can be implemented by reversing a polarity of the transistors and reversing the first and second supply nodes.

As discussed with respect to the TDC 500 of FIG. 5, when the reset input R receives a logic high reset signal RESET, the buffer output B and the data output Q can be cleared to a logic low, in this example. Also, when the data input D is a logic high (corresponding to a spot being present), a high gate signal GATE applied to the gate input G allows a logic high to transmit to the data output Q, thereby propagating the spot from the TDC spot circuit's input to output. The state of the spot can be read at the buffer output B while the read buffer input RDB is logically low.

Including the read buffer input RDB and corresponding read PMOS 620 can prevent the buffered output B from transitioning when the a spot is propagating from the data input D to the gate input G. Configuring the TDC spot circuit 600 in this manner can result in the buffered output stage 605 in providing a relatively small and constant capacitive load on the first signal node V1. Additionally, including the PMOS 620 can reduce power consumption compared to other configurations which do not include the PMOS 620 because the TDC spot circuit 600 can allow the TDC to reduce decoding logic operations and to only operate upon demand: the decoding logic can be programmed to run only when needed.

Applications

Devices employing the above described spot circuitry can be implemented into various electronic devices. Examples of the electronic devices can include, but are not limited to, consumer electronic products, parts of the consumer electronic products, electronic test equipment, etc. Examples of the electronic devices can also include circuits of optical networks or other communication networks. The consumer electronic products can include, but are not limited to, an automobile, a camcorder, a camera, a digital camera, a portable memory chip, a washer, a dryer, a washer/dryer, a copier, a facsimile machine, a scanner, a multifunctional peripheral device, etc. Further, the electronic device can include unfinished products, including those for industrial, medical and automotive applications.

The foregoing description and claims may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

Although this invention has been described in terms of certain embodiments, other embodiments that are apparent to those of ordinary skill in the art, including embodiments that do not provide all of the features and advantages set forth herein, are also within the scope of this invention. Moreover, the various embodiments described above can be combined to provide further embodiments. In addition, certain features shown in the context of one embodiment can be incorporated into other embodiments as well. Accordingly, the scope of the present invention is defined only by reference to the appended claims.

What is claimed is:

1. An electronic circuit comprising:
a plurality of spot moving stages configured to move a spot represented by a logically high value based on timing of a single phase clock signal, wherein the plurality of spot moving stages comprise:
a first spot moving stage comprising a first spot input, a first spot output, and a first plurality of field-effect transistors (FETs) configured to selectively control the first spot output based on a logic value of the first spot input and on timing of the single phase clock signal; and
a second spot moving stage comprising a second spot input electrically connected to the first spot output, a second spot output, and a second plurality of FETs configured to selectively control the second spot output based on a logic value of the second spot input and on timing of the single phase clock signal,
wherein when the first spot input has the logically high value indicating presence of the spot, the first plurality of FETs control the first spot output to the logically high value in response to a falling edge of the single phase clock signal, and wherein when the first spot input has a logically low value, the first plurality of FETs do not control the first spot output.

2. The electronic circuit of claim 1, wherein the first spot moving stage further comprises a feedback element configured to control the first spot input to the logically low value in response to the first spot output transitioning from the logically low value to the logically high value.

3. The electronic circuit of claim 2, wherein the first spot moving stage is configured such that the spot is present at the first spot input for about a full clock cycle of the single phase clock signal.

4. The electronic circuit of claim 1, wherein when the second spot input has a logically high value, the second plurality of FETs control the second spot output to the logically high value in response to a falling edge of the single phase clock signal, and wherein when the second spot input has the logically low value, the second plurality of FETs do not control the second spot output.

5. The electronic circuit of claim 1, wherein the plurality of spot moving stages are electrically connected in a ring, the plurality of spot moving stages configured to generate a divided clock signal based on a time taken to move the spot around the ring, the divided clock signal having a lower frequency than the single phase clock signal.

6. The electronic circuit of claim 5, wherein the first plurality of FETs comprises a clock n-type field-effect transistor (NFET), an input NFET connected in series with the clock NFET between a signal node and a first supply node, an input p-type field-effect transistor (PFET) connected between a second supply node and the signal node, a clock PFET, and an output PFET electrically connected in series with the clock PFET between the second supply node and the first spot output, wherein a gate of the clock NFET and a gate of the clock PFET receive the single phase clock signal, wherein a gate of the output PFET is connected to the signal node, and wherein a gate of the input PFET and a gate of the input NFET are connected to the first spot input.

7. The electronic circuit of claim 1, wherein the plurality of spot moving stages are electrically connected in a cascade, the plurality of spot moving stages configured to generate a digital representation of a time duration of a pulse of the single phase clock signal.

8. The electronic circuit of claim 7, wherein the first plurality of FETs comprises a clock NFET, an input NFET connected in series with the clock NFET between a signal node and a first supply node, an input PFET connected between a second supply node and the signal node, and an output PFET electrically connected between the second supply node and the first spot output, wherein a gate of the clock NFET receives the single phase clock signal, wherein a gate of the output PFET is connected to the signal node, and wherein a gate of the input PFET and a gate of the input NFET are connected to the first spot input.

9. An electronic circuit comprising:
a plurality of spot moving stages configured to move a spot represented by a logically low value based on timing of a single phase clock signal, wherein the plurality of spot moving stages comprise:
a first spot moving stage comprising a first spot input, a first spot output, and a first plurality of field-effect transistors (FETs) configured to selectively control the first spot output based on a logic value of the first spot input and on timing of the single phase clock signal; and
a second spot moving stage comprising a second spot input electrically connected to the first spot output, a second spot output, and a second plurality of FETs configured to selectively control the second spot output based on a logic value of the second spot input and on timing of the single phase clock signal,
wherein when the first spot input has the logically low value indicating presence of the spot, the first plurality of FETs control the first spot output to the logically low value in response to a rising edge of the single phase clock signal, and wherein when the first spot input has a logically high value, the first plurality of FETs do not control the first spot output.

10. The electronic circuit of claim 9, wherein the first spot moving stage further comprises a feedback element configured to control the first spot input to the logically high value in response to the first spot output transitioning from the logically high value to the logically low value.

11. The electronic circuit of claim 10, wherein the first spot moving stage is configured such that the spot is present at the first spot input for about a full clock cycle of the single phase clock signal.

12. The electronic circuit of claim 9, wherein when the second spot input has a logically low value, the second plurality of FETs control the second spot output to the logically low value in response to a rising edge of the single phase clock signal, and wherein when the second spot input has the logically high value, the second plurality of FETs do not control the second spot output.

13. The electronic circuit of claim 9, wherein the plurality of spot moving stages are electrically connected in a ring, the plurality of spot moving stages configured to generate a divided clock signal based on a time taken to move the spot around the ring, the divided clock signal having a lower frequency than the single phase clock signal.

14. The electronic circuit of claim 13, wherein the first plurality of FETs comprises an input NFET connected between a first supply node and a signal node, a clock PFET, an input PFET connected in series with the clock PFET between the signal node and a second supply node, a clock NFET, and an output NFET electrically connected in series with the clock NFET between the first supply node and the first spot output, wherein a gate of the clock PFET and a gate of the clock NFET receive the single phase clock signal, wherein a gate of the output NFET is connected to the signal node, and wherein a gate of the input NFET and a gate of the input PFET are connected to the first spot input.

15. The electronic circuit of claim 9, wherein the plurality of spot moving stages are electrically connected in a cascade, the plurality of spot moving stages configured to generate a digital representation of a time duration of a pulse of the single phase clock signal.

16. The electronic circuit of claim 15, wherein the plurality of spot moving stages comprises between 8 and 1024 spot moving stages.

17. A spot moving circuit stage comprising:
a spot input configured to receive a spot signal having a first logic value when a spot is present and a second logic value when the spot is not present;
a single phase clock input configured to receive a signal phase clock signal varying between the first logic value and the second logic value;
a spot output; and
a plurality of field-effect transistors (FETs) configured to selectively control the spot output based on a logic value of the spot input and on timing of the single phase clock signal,
wherein when the spot input has the first logic value, the plurality of FETs control the spot output to the first logic value in response to a transition of the single phase clock signal from the first logic value to the second logic value, and wherein when the spot input has the second logic value, the plurality of FETs do not control the spot output.

18. The spot moving circuit stage of claim 17, implemented in a time-to-digital converter.

19. The spot moving circuit stage of claim 17, implemented in a frequency divider.

20. The spot moving circuit stage of claim 17, further comprising a feedback element configured to control the spot input to the second logic value in response to the spot output transitioning from the second logic value to the first logic value.

* * * * *